United States Patent [19]
Butler et al.

[11] Patent Number: 5,101,126
[45] Date of Patent: Mar. 31, 1992

[54] WIDE DYNAMIC RANGE TRANSCONDUCTANCE STAGE

[75] Inventors: James R. Butler, San Jose; Douglas S. Smith, Scotts Valley, both of Calif.

[73] Assignee: Analog Devices, Inc., Norwood, Mass.

[21] Appl. No.: 597,794

[22] Filed: Oct. 15, 1990

[51] Int. Cl.$^5$ ................. H03K 19/007; H03K 19/094
[52] U.S. Cl. .................................... 307/493; 307/570; 307/495; 307/355; 307/360; 307/362; 330/300; 330/252; 330/253
[58] Field of Search ............................ 330/300, 252.3; 307/570, 493–495, 355, 360, 362

[56] References Cited

U.S. PATENT DOCUMENTS

| | | | |
|---|---|---|---|
| 4,785,259 | 11/1988 | Seelbach et al. | 330/300 |
| 4,902,984 | 2/1990 | Vinn et al. | 330/252 |
| 4,904,952 | 2/1990 | Tanimoto | 330/252 |

Primary Examiner—Stanley D. Miller
Assistant Examiner—Margaret Rose Wambach
Attorney, Agent, or Firm—Richard S. Koppel

[57] ABSTRACT

A wide dynamic range transconductance stage has two branches, each branch being composed of a plurality of transconductance circuit paths. Each circuit path has a greater transconductance than the other circuit paths for its branch within a respective sub-range of the input signal range for the stage as a whole, with each path dominating the other paths for its branch within its respective sub-range. The overall bandwidth for the stage, its $g_m$, its noise characteristics and its input voltage range are enhanced as a result. Bandwidth and slew rate may be independently optimized by the designer. Two paths are used for each branch in the preferred embodiment, with one path consisting of a bipolar transistor and the other path either a field effect transistor or a resistor degenerated bipolar transistor. Multiple paths may be used based on the same principle.

20 Claims, 3 Drawing Sheets 5,101,126

WIDE DYNAMIC RANGE TRANSCONDUCTANCE STAGE

BACKGROUND OF THE INVENTION

1. Field of the Invention

This invention relates to transconductance stages designed to produce a differential output current in response to a differential input voltage.

2. Description of the Related Art

Transconductance stages are commonly employed to convert a differential voltage input signal to a differential current output signal with amplification for application to a downstream stage of an overall circuit. Transconductance stages are applicable to circuits such as operational amplifiers, digital-to-analog converters, analog-to-digital converters, power amplifiers, buffers, comparators and instrumentation amplifiers.

The two common forms of transconductance stages use either bipolar transistors or junction field effect transistors (JFETs). The selection of one type or the other involves a trade-off between the particular advantages of each.

A conventional transconductance stage employing bipolar input transistors is shown in FIG. 1. A differential input voltage signal is applied across a pair of input terminals IN1 and IN2, which are connected respectively to the bases of input bipolar transistors Q1 and Q2. The transistors are illustrated as pnp devices, but the circuit could be re-configured with reverse polarities for npn transistors.

A current source I1 is biased by a positive voltage bus V+ to supply current to the common emitter connection of Q1 and Q2. The collectors of Q1 and Q2 are connected through respective resistors R1 and R2 to a negative voltage bus V−. A differential current output is taken from the collectors of Q1 and Q2 and delivered to the next stage, illustrated as operational amplifier 2, in the overall circuit. The input transconductance stage may be designed to also provide a voltage gain if required by the second stage, but voltage gain is not required in all cases. The transconductance stage generally drives some form of load capacitance such as a phase compensation circuit.

The output differential current (the difference between the two currents supplied to the second stage 2) is the product of the input voltage differential times the transconductance $g_m$ of the transconductance stage. The bipolar stage of FIG. 1 is characterized by a high $g_m$, which results in a good high frequency response with an accompanying wide bandwidth, and a low level of background noise. However, bipolar input stages saturate at a relatively low input voltage level of about 100 mV, resulting in a limited output current and degradation of slew rate for large signal inputs.

A typical JFET transconductance input stage is shown in FIG. 2. This circuit is essentially similar to that of FIG. 1, except that bipolar transistors Q1 and Q2 have been replaced by JFETs J1 and J2, with the input voltage signals applied to their gates. The JFET circuit will not saturate up to input voltages of about 1 V, and therefore exhibits a higher slew rate for large signal inputs than the bipolar circuit. On the other hand, the JFET stage has a lower $g_m$ than the bipolar stage, resulting in a corresponding reduction in bandwidth and increase in background noise level.

SUMMARY OF THE INVENTION

The present invention provides a new type of transconductance stage which achieves a greater $g_m$ over a wider voltage range than either the conventional bipolar or JFET circuits of FIGS. 1 and 2, with an accompanying improvement in bandwidth and background noise, and yet exhibits a slew rate comparable to that of the prior JFET circuit for large signal inputs.

These improvements are achieved with a transconductance stage in which each of the two circuit branches are designed with a plurality of transconductance circuit paths, each path having a greater transconductance than the other paths for its branch within a respective sub-range of the input signal voltage range. Each path dominates the other paths of its branch within its respective input signal sub-range to establish an overall transconductance having optimum characteristics.

In the preferred embodiment, one path is implemented as a bipolar transistor which provides a dominant $g_m$ for low input signal levels. The other path is implemented by circuitry having a higher $g_m$ than the bipolar transistor at larger input signals, such as a junction field effect transistor, metal-oxide-semiconductor field effect transistor, or a bipolar transistor/resistor series circuit. Various alternate circuit connections are possible so that the element having the appropriate $g_m$ for a particular input signal level is dominant at that input level. The circuits shown have two transconductance paths, but the principle can be used for multiple paths.

These and other features and advantages of the invention will be apparent to those skilled in the art from the following detailed description, taken together with the accompanying drawings, in which:

DETAILED DESCRIPTION OF THE INVENTION

Figures 1, 2, 3:
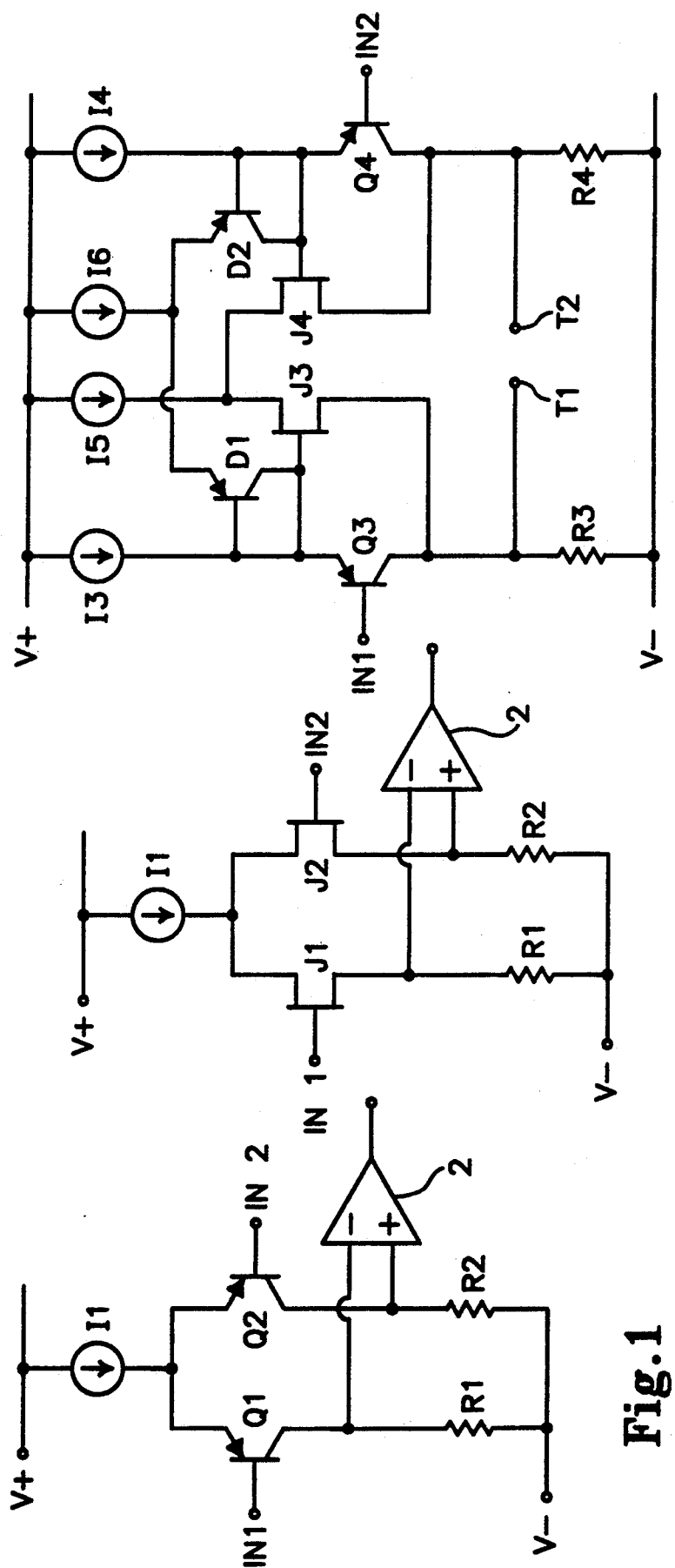
FIGS. 1 and 2 are schematic diagrams of prior transconductance stages, discussed above.
FIGS. 3 and 4 are schematic diagrams of two implementations of the invention employing bipolar transistors for the low signal dominant path and field effect transistors for the high signal dominant path.

An initial embodiment of the invention is shown in FIG. 3. In this circuit the differential voltage input signals are applied to the bases of a pair of pnp bipolar transistors Q3 and Q4. Current sources I3 and I4 supply current to the collector-emitter circuits of Q3 and Q4, respectively. I3 and I4 are connected between the positive voltage bus V+ and the emitters of pnp transistors Q3,Q4, while the transistor collectors are respectively connected through resistors or other suitable impedances R3,R4 to the negative voltage bus V−. Output terminals T1,T2 for a differential current output are connected respectively to the opposite sides of R3 and R4 from the negative voltage bus.

Additional circuit paths between the positive voltage bus and resistors R3,R4 are provided by field effect transistors (FETs) J3,J4, which can be implemented as either junction FETs (JFETs) or metal-oxide-semiconductor FETs (MOSFETs). The source-drain circuits of J3 and J4 are supplied with current by a current source I5 tied to positive bus V+, with the opposite sides of the J3,J4 source-drain circuits connected respectively to the common connections for R3/Q3 and R4/Q4. Finally, a pair of impedances in the form of diode-connected bipolar transistors D1,D2 are connected to divide the current from another current source I6 between the emitter circuits of Q3 and Q4, respectively; I6 is also tied to positive voltage bus V+. The gates of J3 and J4 are connected in common with D1 and D2 to the emitters of Q3 and Q4, respectively.

With the described circuit, the input voltage differential can vary up to about 1 volt before saturating. For small signal inputs on the order of 0.1 volt or less, the $g_m$ of the bipolar transistors Q3,Q4 will dominate over the $g_m$ of the FETs J3, J4 in establishing a transconductance for the overall stage.

The transconductance $g_m$ for the bipolar transistors Q3, Q4 follows the relationship:

$$g_m = I_s/2V_t,$$

where $V_t = kT/q$, which is equal to about 25 mV at room temperature, and $I_s$ is the stage current. The transconductance $g_m$ for the FETs J3,J4, on the other hand, follows the relationship:

$$g_m = \sqrt{2\beta I_s}$$

where $\beta$ for a JFET is defined as $I/V^2$ ($\beta$ is conventionally termed the "transconductance" for a JFET, even though transconductance is normally in the form $I/V$).

$\beta$ for J3 and J4 will vary with the processing technique used, and the size of the FETs. J3 and J4 are scaled and the stage currents are selected so that J3 and J4 do not have a substantial effect upon the input stage for small input signals on the order of 0.1 volts or less.

In one example, I3, I4 and I6 were set equal to each other at 50 microamps, while I5 was 300 microamps. $g_m$ for bipolar transistors Q3,Q4 was approximately twice the $g_m$ for FETs J3,J4 for small input signals. Since $g_m$ for the bipolar and FET paths are additive, the $g_m$ for the overall transconductance stage was about 3 times the $g_m$ for J3 and J4, and about 3/2 the $g_m$ for Q3 and Q4. Accordingly, since bandwidth varies with $g_m$, the bandwidth for the overall stage was about 3 times the bandwidth of J3,J4 alone, and about 3/2 the bandwidth of Q3,Q4 alone. In addition, the background noise of the circuit was reduced compared to J3,J4 acting by themselves, since noise varies inversely with $g_m$.

For an input voltage differential greater than about 100 mV, the diode D1 or D2 conducting current to the bipolar transistor Q3 or Q4 having the higher input voltage will be cut off. The bipolar transistors Q3 and Q4 will then conduct substantially constant currents, despite changes in the input voltage signals, so long as the input voltage differential remains above about 100 mV.

The FETs J3,J4 will not saturate until the input differential voltage reaches about 1 volt (the exact saturation level is somewhat dependent upon the processing used to fabricate the devices). For low signal inputs below about 100 mV, the current through Q3 and Q4 will vary in accordance with their respective base voltages; current source I6 will contribute more current to the bipolar transistor with the higher bias. With Q3 and Q4 above about 100 mV, however, any further increases in base voltage differential will not result in an additional change in their currents. Accordingly, $g_m$ for the bipolar transistors is zero above about 100 mV, and $g_m$ for the overall stage is governed by J3 and J4 for the large signal regime of about 100 mV to 1 volt. The described circuit thus retains the improved performance of FETs for higher input differential signals, and actually exceeds the performance of the bipolar transistors for low signal inputs.

I3 and I4 provide charging current for the capacitance associated with J3 and J4, and also ensure that Q3 and Q4 never turn off. This latter feature avoids the phase delays that would normally be associated with Q1 and Q2 turning on.

The scaling of Q3 and Q4 is a tradeoff between current gain $\beta$ and background noise. To enhance $\beta$, Q3 and Q4 should be minimum geometry devices. To reduce background noise, on the other hand, Q3 and Q4 should be scaled to increase the base area and thus minimize the associated base resistances.

The magnitude of current from I5 determines the maximum large signal differential current, which in turn determines the slew rate. I5 is normally substantially larger than I3, I4 or I6. The scaling of J3 and J4 is determined primarily by the magnitude of I5. J3 and J4 have to be large enough to accommodate the I5 current, but preferably not substantially larger. If they are larger than necessary to handle I5, they will have a larger $g_m$ and thus a greater effect on the overall transconductance stage $g_m$ in the small signal regime, where it is desired that the bipolar transistors Q3, Q4 dominate. Keeping the scaling of J3 and J4 down also helps to save space on the circuit die.

Figure 4:
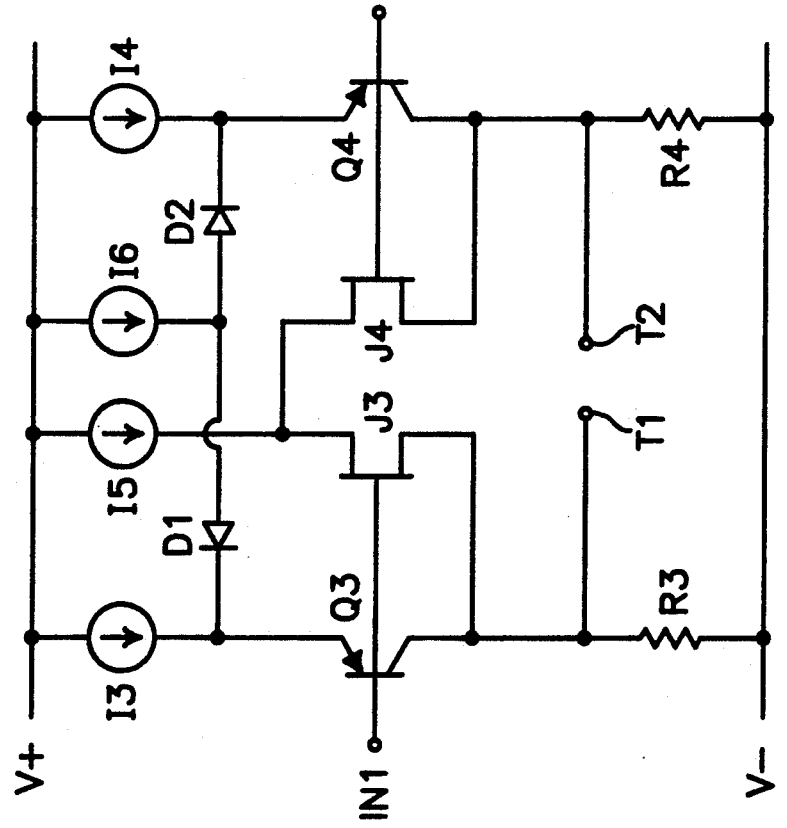

An alternate embodiment is illustrated in FIG. 4. The circuit elements are connected the same as in FIG. 3, except the gates of J3 and J4 are connected respectively to the bases of Q3 and Q4, rather than to their emitters. This embodiment provides a performance equivalent to that of FIG. 3, but requires larger drive currents because the input capacitances of J3 and J4 are not buffered.

In both FIG. 3 and FIG. 4, p-channel FETs would be used in conjunction with pnp bipolar transistors, and n-channel FETs with npn bipolar transistors. Conventional BiMOS or BiFET processing could be used to fabricate the bipolar and FET devices together on the same chip.

Figure 5:
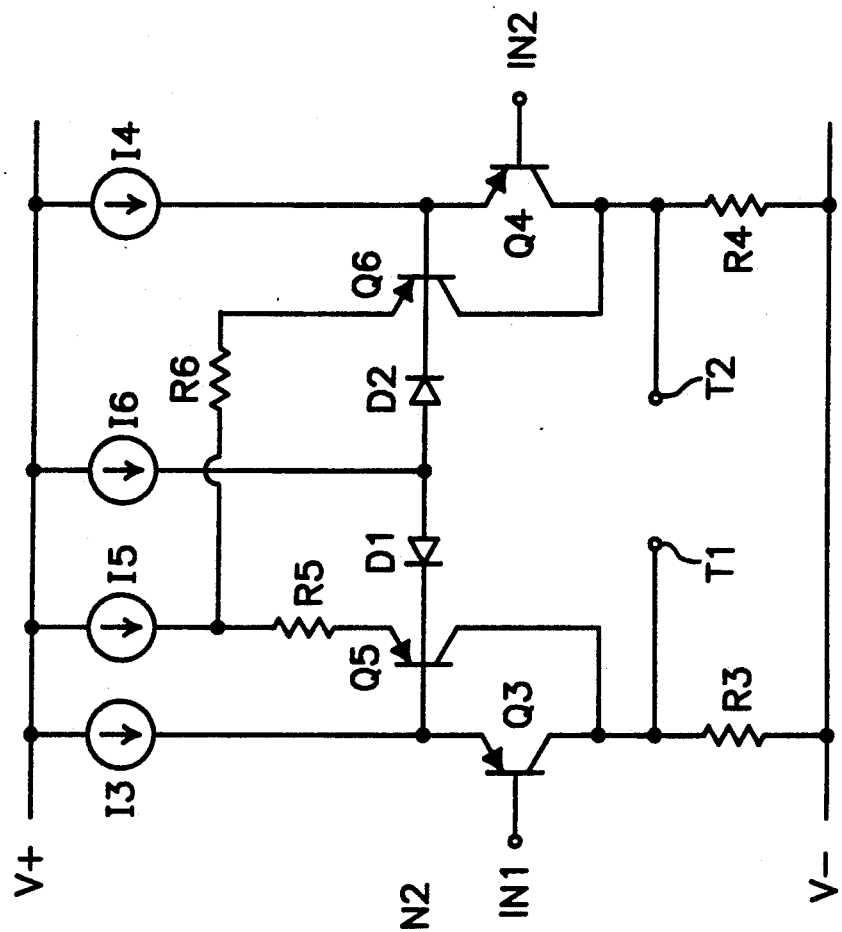
FIG. 5 is a schematic diagram of another embodiment in which a series bipolar transistor/resistor circuit is substituted for a field effect transistor as the high signal dominant path.

Another variation is shown in FIG. 5. In this design the FETs J3,J4 are replaced by bipolar transistors Q5,Q6, respectively, with the collector-emitter circuits of Q5 and Q6 connected to receive current from I5 through resistors R5 and R6. The resistor degenerated bipolar transistors Q5,Q6 operate as current sources in a manner similar to a JFET, with a reduced $g_m$. Larger resistors R5,R6 reduce the $g_m$ of the Q5/R5 and Q6/R6 circuits for the same current level. These resistors can be selected to yield a desired tradeoff between $g_m$ and voltage range. The bases of Q5 and Q6 could also be connected to the bases of Q3 and Q4, rather than their emitters, in a fashion analogous to the circuit of FIG. 4.

Figures 6, 7, 8:
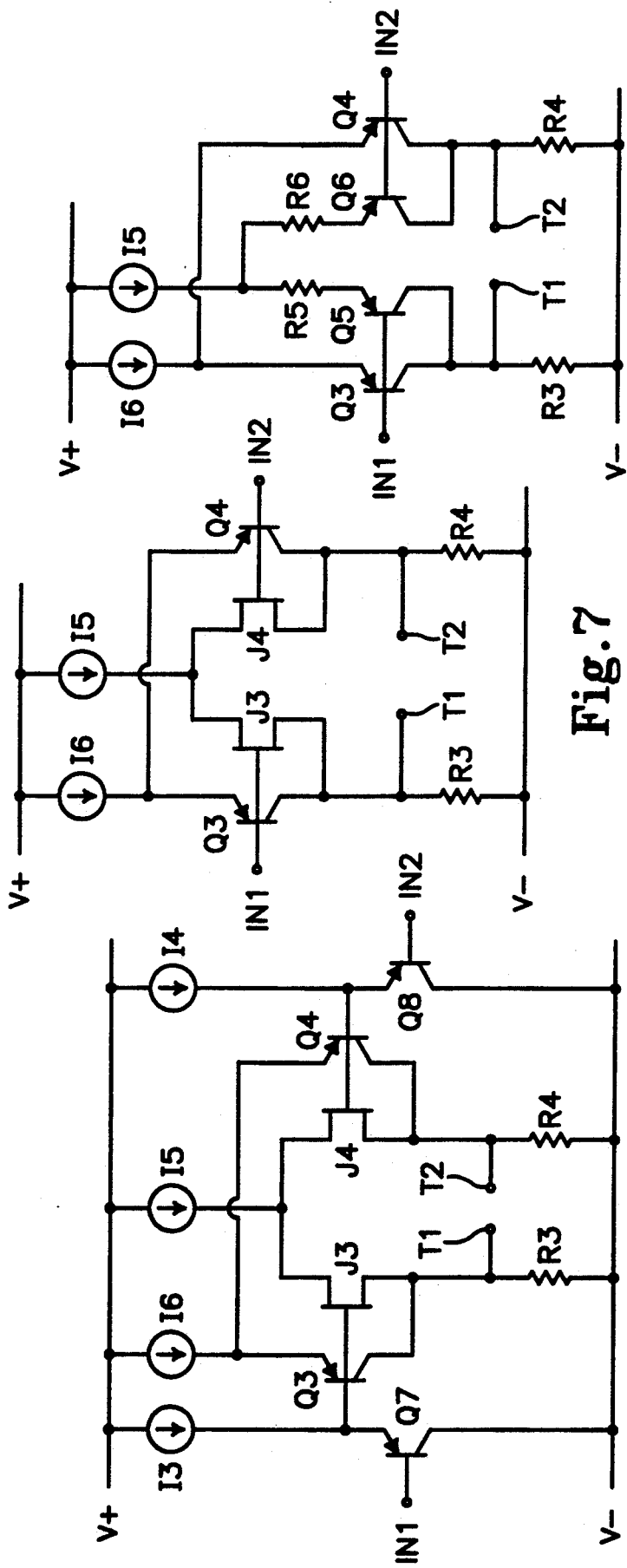
FIG. 6 is a schematic diagram of a different embodiment in which the use of diodes is avoided, and input buffer stages are included.
FIG. 7 is a schematic diagram of a circuit similar to FIG. 6 but without the input buffer circuits, and with fewer current sources.
FIG. 8 is a schematic diagram of an embodiment similar to that of FIG. 7, in which a series bipolar transistor/resistor circuit is substituted for a field effect transistor as the high signal dominant path.

A preferred embodiment which eliminates diodes D1,D2 and adds an input buffer stage is shown in FIG. 6, with equivalent elements again identified by the same reference numerals as in FIG. 5. In this circuit the collector-emitter circuits of Q3 and Q4 are connected directly to current source I6, without any intermediary diodes or other impedances. The gates of J3 and J4 are connected respectively to the bases of Q3 and Q4. Input buffer circuits are provided to increase the input impedance. The input buffer circuit for Q3 consists of a bipolar transistor Q7 having its collector-emitter circuit connected between the base of Q3 and negative voltage bus V−, with its base receiving an input voltage and its emitter driving the base of Q3. Current source I3 is connected between V+ and the collector emitter circuit of Q7 to keep the transistor on. A similar buffer circuit consisting of bipolar transistor Q8 and current source I4 is provided for Q4.

In addition to having a substantially greater input impedance due to the emitter-follower function of Q7 and Q8, the circuit of FIG. 6 also exhibits a larger small signal $g_m$, as compared to the circuits of FIGS. 3-5. This is because the input signals for FIGS. 3-5 are divided between the input transistors Q3,Q4, and their respective diodes D1,D2, so that only a portion of the input differential voltage appears across Q3 and Q4. With the circuit of FIG. 6, by contrast, the entire input differential signal appears across Q3 and Q4, producing a correspondingly greater change in the output current differential for a given change in a small signal differential voltage input.

In a particular implementation of the FIG. 6 circuit, I3, I4 and I6 were each 40 microamps, while I5 was 200 microamps. J3 and J4 were scaled with a width/length ratio of 36, the absolute length dimensions being about 16 microns. The sizes of Q3 and Q4 are very process-dependent, but they were scaled with emitters approximately 3 times the minimum size possible with the particular fabrication process used. This scaling was selected as a tradeoff between a larger size to reduce background noise, and a smaller size to enhance the frequency response. Q7 and Q8 were minimum geometry devices. Resistors R3 and R4 were 2.5 kohms each.

The circuit of FIG. 6 can be modified by eliminating the input buffer circuits; the resulting circuit is shown in FIG. 7, with the input voltage signals applied directly to the bases of Q3,Q4 and the gates of J3,J4. This circuit exhibits a lower input impedance than FIG. 6, but should have an improved input offset voltage ($V_{os}$), since Q1 and Q2 are no longer present to contribute to $V_{os}$. It also has the advantage of using fewer elements.

The FETs used in FIGS. 6 and 7 could be replaced by resistor degenerated bipolar transistor circuits, as shown in FIG. 8. J3 has been replaced with bipolar transistor Q5 and series connected resistor R5, while J4 has been replaced by bipolar transistor Q6 with series connected resistor R6, in a manner analogous to the circuit of FIG. 5.

Several different embodiments of a transconductance stage with improvements in both $g_m$, bandwidth, noise characteristics and input signal range have thus been shown and described. Numerous other variations and alternate embodiments will occur to those skilled in the art. For example, while two transconductance paths are shown for each branch in the circuits of FIGS. 3-8, one or more additional transconductance paths could also be provided for each branch, with each path having a greater transconductance than the other paths for its branch within a respective sub-range of the input signal range. Each path would dominate the other transconductance paths for its branch within its respective input signal sub-range in establishing the overall transconductance of the stage over its entire input signal range. A specific example of a circuit with three transconductance paths in each branch would be a combination of FIGS. 4 and 5. In this circuit the left branch would have separate transconductance paths defined by Q3, J3 and Q5/R5, while the right branch would have separate transconductance paths defined by Q4, J4 and Q6/R6. Also, npn bipolar transistors could be substituted for the pnp transistors illustrated in FIGS. 3-8, with appropriate reversals made to the circuit polarities. Accordingly, it is intended that the invention be limited only in terms of the appended claims.

We claim:

1. A wide dynamic range transconductance stage operative over an input voltage differential signal range, comprising:
   a pair of transconductance circuit branches for receiving a differential voltage, and
   respective output locations associated with each branch,
   each branch comprising a similar plurality of transconductance circuit paths to said output locations, each transconductance circuit path having a greater transconductance than the other transconductance circuit paths for its branch within a respective sub-range of said input voltage differential signal range, each transconductance circuit path dominating the other transconductance circuit paths for its branch within its respective input signal sub-range in establishing an overall transconductance for the transconductance stage, each transconductance circuit path actively contributing to said overall transconductance but not dominating the other transconductance circuit paths for its branch over the full extent of said input voltage differential signal range outside its respective input signal subrange.

2. The wide dynamic range transconductance stage of claim 1, wherein a pair of transconductance circuit paths are provided for each branch.

3. The wide dynamic range transconductance stage of claim 2, one transconductance circuit path of each branch comprising a junction field effect transistor (JFET) circuit and the other transconductance circuit path of each branch comprising a bipolar transistor circuit, the JFET circuits dominating for higher input voltage differential signals within said input signal range, and the bipolar transistor circuits dominating for lower input voltage differential signals within said input signal range.

4. The wide dynamic range transconductance stage of claim 2, one transconductance circuit path of each branch comprising a metal-oxide-semiconductor field effect transistor (MOSFET) circuit and the other transconductance circuit path of each branch comprising a bipolar transistor circuit, the MOSFET circuits dominating for higher input voltage differential signals within said input signal range, and the bipolar transistor circuits dominating for lower input voltage differential signals within said input signal range.

5. A wide dynamic range transconductance stage operative over an input voltage differential signal range, comprising;
   a pair of transconductance circuit branches for receiving a differential voltage, and
   respective output locations associated with each branch,
   each branch comprising a pair of transconductance circuit paths to said output locations, each transconductance circuit path having a greater transconductance than the other transconductance circuit paths for its branch within a respective sub-range of said input voltage differential signal range, each transconductance circuit path dominating the other transconductance circuit paths for its branch within its respective input signal sub-range in establishing an overall transconductance for the transconductance stage, one transconductance circuit path of each branch comprising a series bipolar transistor/resistor circuit and the other transconductance circuit path of each branch comprising a bipolar transistor circuit, said series bipolar transistor/resistor circuits dominating for higher input voltage differential signals within said input voltage differential signal range, and said bipolar transistor circuits dominating for lower input voltage differential signals within said input voltage differential signal range.

6. A wide dynamic range transconductance stage operative over an input voltage differential signal range, comprising:
   a pair of transconductance circuit branches for receiving a differential voltage,
   respective output locations associated with each branch,
   each branch comprising a pair of transconductance circuit paths to said output locations, each transconductance circuit path having a greater transconductance than the other transconductance circuit paths for its branch within a respective sub-range of said input voltage differential signal range, each transconductance circuit path dominating the other transconductance circuit paths for its branch within its respective input signal sub-range in establishing an overall transconductance for the transconductance stage, comprising a circuit path which dominates for higher input voltage differential signals within said input voltage differential signal range, and the other transconductance path of each branch comprising a bipolar transistor circuit, each bipolar transistor circuit comprising a bipolar transistor having a base and a collector-emitter circuit with its base receiving an input voltage signal, an impedance connected in series with its collector-emitter circuit, and a first current source connected to said collector-emitter circuit on the other side of said transistor from the impedance, the output from the branch being taken from said impedance, and
   an additional current source supplying current to the collector-emitter circuits of the bipolar transistors in each circuit path from the same side of said collector-emitter circuits as said first current sources, said bipolar transistors dividing the current from said additional current source in accordance with the input voltage differential signal applied to their bases.

7. A wide dynamic range transconductance stage operative over an input voltage differential signal range, comprising:
   positive and negative voltage buses,
   first and second bipolar transistors having respective bases and collector-emitter circuits, the bases of said bipolar transistors being connected to receive respective input voltage signals of an input voltage differential signal,
   first and second current sources connected between one of said voltage buses and one side of the collector-emitter circuits of said first and second bipolar transistors, respectively, to supply current to said bipolar transistors,
   first and second impedances connected between the other of said voltage buses and the other side of the collector-emitter circuits of said first and second bipolar transistors, respectively, such that outputs from said transconductance stage may be taken from said impedances,
   a third current source connected to said one voltage bus,
   third and fourth impedances connected to conduct respective currents between said third current source and the collector-emitter circuits for said first and second bipolar transistors, said respective currents accumulating with the currents supplied by said first and second current sources, said first and second bipolar transistors dividing the current from said third current source in accordance with the input voltage signals applied to their respective bases, and
   a first transconductance circuit connected in parallel with the circuit formed by said first bipolar transistor and said first current source circuit, and a second transconductance circuit connected in parallel with the circuit formed by said second bipolar transistor and said second current source circuit, said first and second transconductance circuits having a greater transconductance than said bipolar transistors for higher input voltage differential signals within said range, and a lesser transconductance than said bipolar transistors for lower input voltage differential signals within said range.

8. The wide dynamic range transconductance stage of claim 7, said transconductance circuits comprising respective field effect transistors (FETs) having respective gates and source-drain circuits, and a fourth current source connected to said one voltage bus to supply respective currents to said FETs, each FET having its source-drain circuit connected between said fourth current source and the impedance for a respective one of said first and second bipolar transistors, and its gate connected to said respective bipolar transistor.

9. The wide dynamic range transconductance stage of claim 8, said FETs comprising junction FETs.

10. The wide dynamic range transconductance stage of claim 8, said FETs comprising metal-oxide-semiconductor FETs.

11. The wide dynamic range transconductance stage of claim 8, wherein the FET gates are connected to the collector-emitter circuits of their respective bipolar transistors on the same side as said first and second current sources.

12. The wide dynamic range transconductance stage of claim 8, wherein the FET gates are connected to the bases of their respective bipolar transistors.

13. The wide dynamic range transconductance stage of claim 7, said transconductance circuits respectively comprising third and fourth bipolar transistors having respective bases and collector-emitter circuits, a fourth current source connected to said one voltage bus to supply respective currents to said third and fourth bipolar transistors, the collector-emitter circuits of said third and fourth bipolar transistors being connected in series with respective resistors between said fourth current source and the impedances for their respective first or second bipolar transistors, and the bases of said third and fourth bipolar transistors being connected to said respective first and second bipolar transistors, said resistors being selected to extend the dynamic range of said transconductance circuits beyond that of said first and second bipolar transistors.

14. The wide dynamic range transconductance stage of claim 13, wherein the bases of said third and fourth bi-polar transistors are connected to the same side of the collector-emitter circuits of their respective first and second bipolar transistors as said first and second current sources.

15. The wide dynamic range transconductance stage of claim 13, wherein the bases of said third and fourth bipolar transistors are connected to the bases of their respective first and second bipolar transistors.

16. The wide dynamic range transconductance stage of claim 7, said third and fourth impedances comprising respective diodes.

17. A wide dynamic range transconductance stage operative over an input voltage differential signal range, comprising:
  positive and negative voltage buses,
  first and second bipolar transistors having respective bases and collector-emitter circuits, the bases of said bipolar transistors being connected to receive respective input voltage signals of an input voltage differential signal,
  a first current source connected between one of said voltage buses and one side of the collector-emitter circuits of said first and second bipolar transistors to supply current to said bipolar transistors,
  first and second impedances connected between the other of said voltage buses and the other side of the collector-emitter circuits of said first and second bipolar transistors, respectively, such that outputs from said transconductance stage may be taken from said impedances,
  a second current source connected to said one voltage bus, and
  first and second transconductance elements connected between said second current source and said other sides of the first and second bipolar transistor collector-emitter circuits, respectively, said first and second transconductance elements having greater transconductances than said bipolar transistors for higher input voltage differential signals within said range, and lesser transconductances than said bipolar transistors for lower input voltage differential signals within said range, said first and second transconductance elements having controls which are connected in common with the bases of said first and second bipolar transistors, respectively, to receive said respective input voltage signals.

18. The wide dynamic range transconductance stage of claim 17, said transconductance elements comprising respective field effect transistors (FETs) having respective gates and source-drain circuits, with their source-drain circuits connected between said second current source and the impedances for their respective bipolar transistors, and their gates connected in common with the bases of their respective bipolar transistors to receive said respective input voltage signals, said first and second FETs dividing the current from said second current source in accordance with said input voltage signals.

19. The wide dynamic range transconductance stage of claim 17, said transconductance elements respectively comprising third and fourth bipolar transistors having respective bases and collector-emitter circuits, the collector-emitter circuits of said third and fourth bipolar transistors being connected in series with respective resistors between said second current source and the impedances for their respective first or second bipolar transistors, and the bases of said third and fourth bipolar transistors being connected in common with the bases of their respective first or second bipolar transistors to receive said respective input voltage signals, said third and fourth bipolar transistors dividing the current from said second current source in accordance with said input voltage signals.

20. The wide dynamic range transconductance stage of claim 17, further comprising a pair of input buffer circuits comprising third and fourth current sources connected to said one voltage bus, third and fourth bipolar transistors having collector-emitter circuits connected on one side to said third and fourth current sources, respectively, and to the bases of said first and second bipolar transistors, respectively, and on the other side to said second voltage bus, and bases connected to receive respective input voltage signals, said buffer circuits providing input signals to the bases of said first and second bipolar transistors and increasing the input impedance of said transconductance stage.

* * * * *